(12) United States Patent
Kobayashi et al.

(10) Patent No.: US 11,418,266 B2
(45) Date of Patent: Aug. 16, 2022

(54) POWER OVER FIBER SYSTEM

(71) Applicant: KYOCERA Corporation, Kyoto (JP)

(72) Inventors: Takahiro Kobayashi, Sagamihara (JP); Shuichi Tamate, Hino (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/442,617

(22) PCT Filed: Jun. 29, 2020

(86) PCT No.: PCT/JP2020/025427
§ 371 (c)(1),
(2) Date: Sep. 24, 2021

(87) PCT Pub. No.: WO2021/019997
PCT Pub. Date: Feb. 4, 2021

(65) Prior Publication Data
US 2022/0094450 A1    Mar. 24, 2022

(30) Foreign Application Priority Data
Jul. 26, 2019   (JP) .............................. JP2019-137375

(51) Int. Cl.
*H04B 10/00*    (2013.01)
*H04B 10/80*    (2013.01)
(Continued)

(52) U.S. Cl.
CPC ........... *H04B 10/808* (2013.01); *H01S 5/042* (2013.01); *H02J 50/30* (2016.02); *H04B 10/25* (2013.01)

(58) Field of Classification Search
CPC ....... H04B 10/808; H04B 10/25; H02J 50/30; H01S 5/042
(Continued)

(56) References Cited

U.S. PATENT DOCUMENTS

| 9,425,769 | B1 * | 8/2016 | White | ............... H01Q 15/0066 |
| 2009/0040781 | A1 | 2/2009 | Ito | |
| 2014/0320313 | A1 * | 10/2014 | Bae | ...................... H04B 10/807 |
| | | | | 307/104 |

FOREIGN PATENT DOCUMENTS

| CN | 101719670 A | 6/2010 |
| JP | 2000152523 A | 5/2000 |

(Continued)

OTHER PUBLICATIONS

Hiroshi Miyakawa et al., "Design approaches to power-over-optical local-area-network systems", Applied Optics, Feb. 20, 2004, p. 1379-1389, vol. 43, No. 6, OSAPublishing, 12pp.

*Primary Examiner* — Mohammad R Sedighian
(74) *Attorney, Agent, or Firm* — Hauptman Ham, LLP

(57) ABSTRACT

A power over fiber system includes a power sourcing equipment, a powered device, an extender, and first and second optical fiber cables. The power sourcing equipment outputs feed light. The extender extends a laser wavelength of the feed light. The first optical fiber cable transmits the feed light from the power sourcing equipment to the extender. The second optical fiber cable transmits the feed light from the extender to the powered device. Based on a loss-to-transmission-length characteristic of the laser wavelength before extended by the extender and a loss-to-transmission-length characteristic of the laser wavelength after extended by the extender, the first optical fiber cable has a length that is equal to or shorter than a transmission length where a loss due to the laser wavelength before extended by the extender is equal to a loss due to the laser wavelength after extended by the extender.

5 Claims, 7 Drawing Sheets

(51) Int. Cl.
*H02J 50/30* (2016.01)
*H01S 5/042* (2006.01)
*H04B 10/25* (2013.01)

(58) Field of Classification Search
USPC .......................................................... 398/171
See application file for complete search history.

(56) References Cited

FOREIGN PATENT DOCUMENTS

| JP | 2010135989 A | 6/2010 |
|---|---|---|
| JP | 201929684 A | 2/2019 |
| WO | 2011158283 A1 | 12/2011 |

* cited by examiner

POWER OVER FIBER SYSTEM

RELATED APPLICATIONS

The present application is a National Phase of International Application No. PCT/JP2020/025427, filed Jun. 29, 2020, and claims priority based on Japanese Patent Application No. 2019-137375, filed Jul. 26, 2019.

TECHNICAL FIELD

The present disclosure relates to a power over fiber system.

BACKGROUND ART

Recently, there has been studied an optical power supply system that converts electric power into light (called feed light), transmits the feed light, converts the feed light into electric energy, and uses the electric energy as electric power.

There is disclosed in Patent Literature 1 an optical communication device that includes: an optical transmitter that transmits signal light modulated with an electric signal and feed light for supplying electric power; an optical fiber including a core that transmits the signal light, a first cladding that is formed around the core, has a refractive index lower than that of the core, and transmits the feed light, and a second cladding that is formed around the first cladding and has a refractive index lower than that of the first cladding; and an optical receiver that operates with electric power obtained by converting the feed light transmitted through the first cladding of the optical fiber, and converts the signal light transmitted through the core of the optical fiber into the electric signal.

CITATION LIST

Patent Literature

Patent Literature 1: JP 2010-135989 A

SUMMARY OF INVENTION

Problem to Solve

In optical power supply, further improvement of optical power supply efficiency is required. As one way therefor, improvement of photoelectric conversion efficiency at the power supplying side and the power receiving side is required.

Solution to Problem

A power over fiber system according to an aspect of the present disclosure includes:

a power sourcing equipment including a semiconductor laser that oscillates with electric power, thereby outputting feed light;

a powered device including a photoelectric conversion element that converts the feed light into electric power;

an extender that extends a laser wavelength of the feed light;

a first optical fiber cable that transmits the feed light from the power sourcing equipment to the extender; and a second optical fiber cable that transmits the feed light from the extender to the powered device, wherein based on a loss-to-transmission-length characteristic of the laser wavelength before extended by the extender and a loss-to-transmission-length characteristic of the laser wavelength after extended by the extender, the first optical fiber cable has a length that is equal to or shorter than a transmission length where a loss due to the laser wavelength before extended by the extender is equal to a loss due to the laser wavelength after extended by the extender.

DESCRIPTION OF EMBODIMENTS

Hereinafter, embodiments of the present disclosure will be described with reference to the drawings.

(1) Outline of System

First Embodiment

Figure 1:
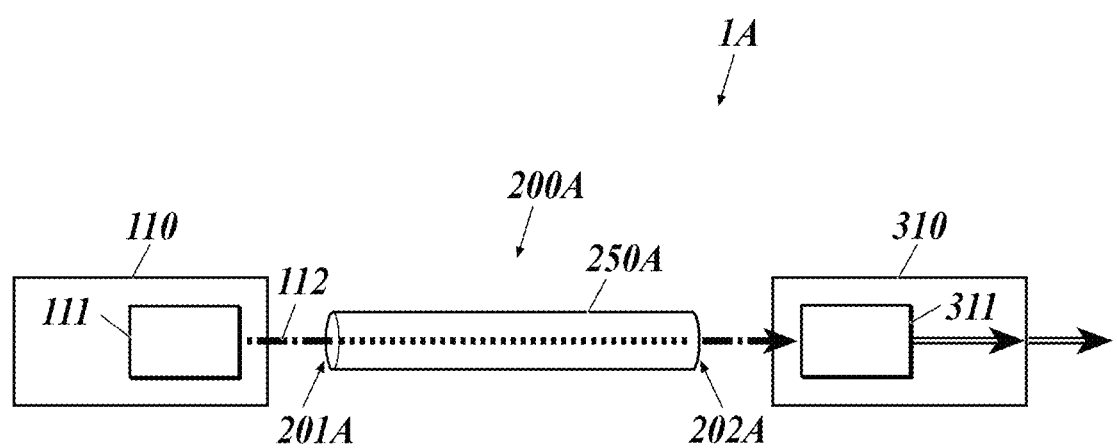
FIG. 1 is a block diagram of a power over fiber system according to a first embodiment of the present disclosure.

As shown in FIG. 1, a power over fiber (PoF) system 1A of this embodiment includes a power sourcing equipment (PSE) 110, an optical fiber cable 200A and a powered device (PD) 310.

In the present disclosure, a power sourcing equipment converts electric power into optical energy and supplies (sources) the optical energy, and a powered device receives (draws) the supplied optical energy and converts the optical energy into electric power.

The power sourcing equipment 110 includes a semiconductor laser 111 for power supply.

The optical fiber cable 200A includes an optical fiber 250A that forms a transmission path of feed light.

The powered device 310 includes a photoelectric conversion element 311.

The power sourcing equipment 110 is connected to a power source, and electrically drives the semiconductor laser 111 and so forth.

The semiconductor laser 111 oscillates with the electric power from the power source, thereby outputting feed light 112.

The optical fiber cable 200A has one end 201A connectable to the power sourcing equipment 110 and the other end 202A connectable to the powered device 310 to transmit the feed light 112.

The feed light 112 from the power sourcing equipment 110 is input to the one end 201A of the optical fiber cable 200A, propagates through the optical fiber 250A, and is output from the other end 202A of the optical fiber cable 200A to the powered device 310.

The photoelectric conversion element 311 converts the feed light 112 transmitted through the optical fiber cable 200A into electric power. The electric power obtained by the conversion of the feed light 112 by the photoelectric conversion element 311 is driving power needed in the powered device 310. The powered device 310 is capable of outputting, for an external device(s), the electric power obtained by the conversion of the feed light 112 by the photoelectric conversion element 311.

Semiconductor materials of semiconductor regions of the semiconductor laser 111 and the photoelectric conversion element 311 are semiconductors having a laser wavelength being a short wavelength of 500 nm or less. The semiconductor regions exhibit light-electricity conversion effect.

Semiconductors having a laser wavelength being a short wavelength have a large band gap and a high photoelectric conversion efficiency, and hence improve photoelectric conversion efficiency at the power supplying side and the power receiving side in optical power supply, and improve optical power supply efficiency.

Hence, as the semiconductor materials, laser media having a laser wavelength (base wave) of 200 nm to 500 nm may be used. Examples thereof include diamond, gallium oxide, aluminum nitride and gallium nitride.

Further, as the semiconductor materials, semiconductors having a band gap of 2.4 eV or greater are used.

For example, laser media having a band gap of 2.4 eV to 6.2 eV may be used. Examples thereof include diamond, gallium oxide, aluminum nitride and gallium nitride.

Laser light having a longer wavelength tends to have a higher transmission efficiency, whereas laser light having a shorter wavelength tends to have a higher photoelectric conversion efficiency. Hence, when laser light is transmitted for a long distance, laser media having a laser wavelength (base wave) of greater than 500 nm may be used as the semiconductor materials, whereas when the photoelectric conversion efficiency is given priority, laser media having a laser wavelength (base wave) of less than 200 nm may be used as the semiconductor materials.

Any of these semiconductor materials may be used in one of the semiconductor laser 111 and the photoelectric conversion element 311. This improves the photoelectric conversion efficiency at either the power supplying side or the power receiving side, and improves the optical power supply efficiency.

Second Embodiment

Figure 2:
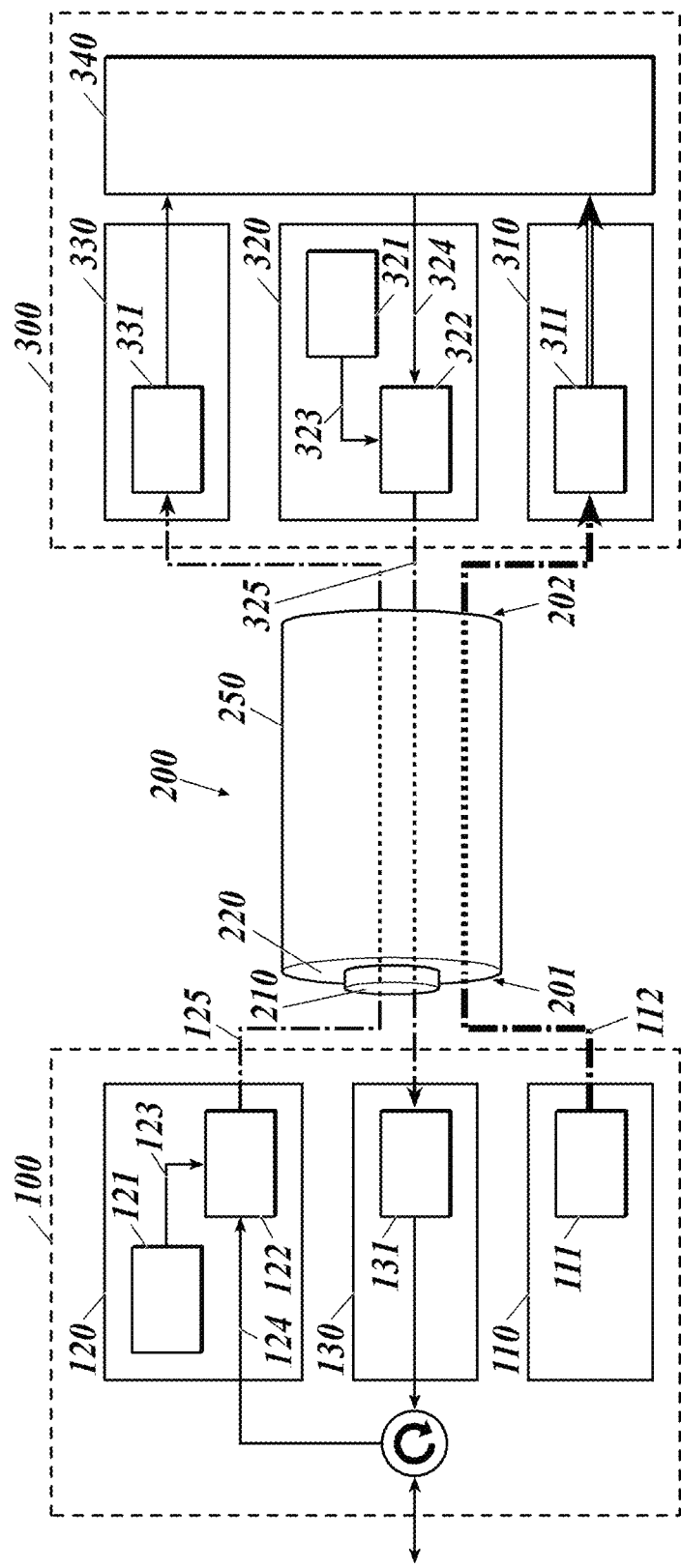
FIG. 2 is a block diagram of a power over fiber system according to a second embodiment of the present disclosure.

As shown in FIG. 2, a power over fiber (PoF) system 1 of this embodiment includes an optical power supply system through an optical fiber and an optical communication system therethrough, and includes: a first data communication device 100 including a power sourcing equipment (PSE) 110; an optical fiber cable 200; and a second data communication device 300 including a powered device (PD) 310.

In the following description, as a general rule, components donated by the same reference signs as those of already-described components are the same as the already-described components unless otherwise stated.

The power sourcing equipment 110 includes a semiconductor laser 111 for power supply. The first data communication device 100 includes, in addition to the power sourcing equipment 110, a transmitter 120 and a receiver 130 for data communication. The first data communication device 100 corresponds to a data terminal equipment (DTE), a repeater or the like. The transmitter 120 includes a semiconductor laser 121 for signals and a modulator 122. The receiver 130 includes a photodiode 131 for signals.

The optical fiber cable 200 includes an optical fiber 250 including: a core 210 that forms a transmission path of signal light; and a cladding 220 that is arranged so as to surround the core 210 and forms a transmission path of feed light.

The powered device 310 includes a photoelectric conversion element 311. The second data communication device 300 includes, in addition to the powered device 310, a transmitter 320, a receiver 330 and a data processing unit 340. The second data communication device 300 corresponds to a power end station or the like. The transmitter 320 includes a semiconductor laser 321 for signals and a modulator 322. The receiver 330 includes a photodiode 331 for signals. The data processing unit 340 processes received signals. The second data communication device 300 is a node in a communication network. The second data communication device 300 may be a node that communicates with another node.

The first data communication device 100 is connected to a power source, and electrically drives the semiconductor laser 111, the semiconductor laser 121, the modulator 122, the photodiode 131 and so forth. The first data communication device 100 is a node in a communication network. The first data communication device 100 may be a node that communicates with another node.

The semiconductor laser 111 oscillates with the electric power from the power source, thereby outputting feed light 112.

The photoelectric conversion element 311 converts the feed light 112 transmitted through the optical fiber cable 200 into electric power. The electric power obtained by the conversion of the feed light 112 by the photoelectric conversion element 311 is driving power needed in the second data communication device 300, for example, driving power for the transmitter 320, the receiver 330 and the data processing unit 340. The second data communication device 300 may be capable of outputting, for an external device(s), the electric power obtained by the conversion of the feed light 112 by the photoelectric conversion element 311.

The modulator 122 of the transmitter 120 modulates laser light 123 output by the semiconductor laser 121 to signal light 125 on the basis of transmission data 124, and outputs the signal light 125.

The photodiode 331 of the receiver 330 demodulates the signal light 125 transmitted through the optical fiber cable 200 to an electric signal, and outputs the electric signal to the data processing unit 340. The data processing unit 340 transmits data of the electric signal to a node, and also receives data from the node and outputs the data to the modulator 322 as transmission data 324.

The modulator 322 of the transmitter 320 modulates laser light 323 output by the semiconductor laser 321 to signal light 325 on the basis of the transmission data 324, and outputs the signal light 325.

The photodiode 131 of the receiver 130 demodulates the signal light 325 transmitted through the optical fiber cable 200 to an electric signal, and outputs the electric signal. Data of the electric signal is transmitted to a node, whereas data from the node is the transmission data 124.

The feed light 112 and the signal light 125 from the first data communication device 100 are input to one end 201 of the optical fiber cable 200, propagate through the cladding 220 and the core 210, respectively, and are output from the other end 202 of the optical fiber cable 200 to the second data communication device 300.

The signal light 325 from the second data communication device 300 is input to the other end 202 of the optical fiber cable 200, propagates through the core 210, and is output from the one end 201 of the optical fiber cable 200 to the first data communication device 100.

Figure 3:
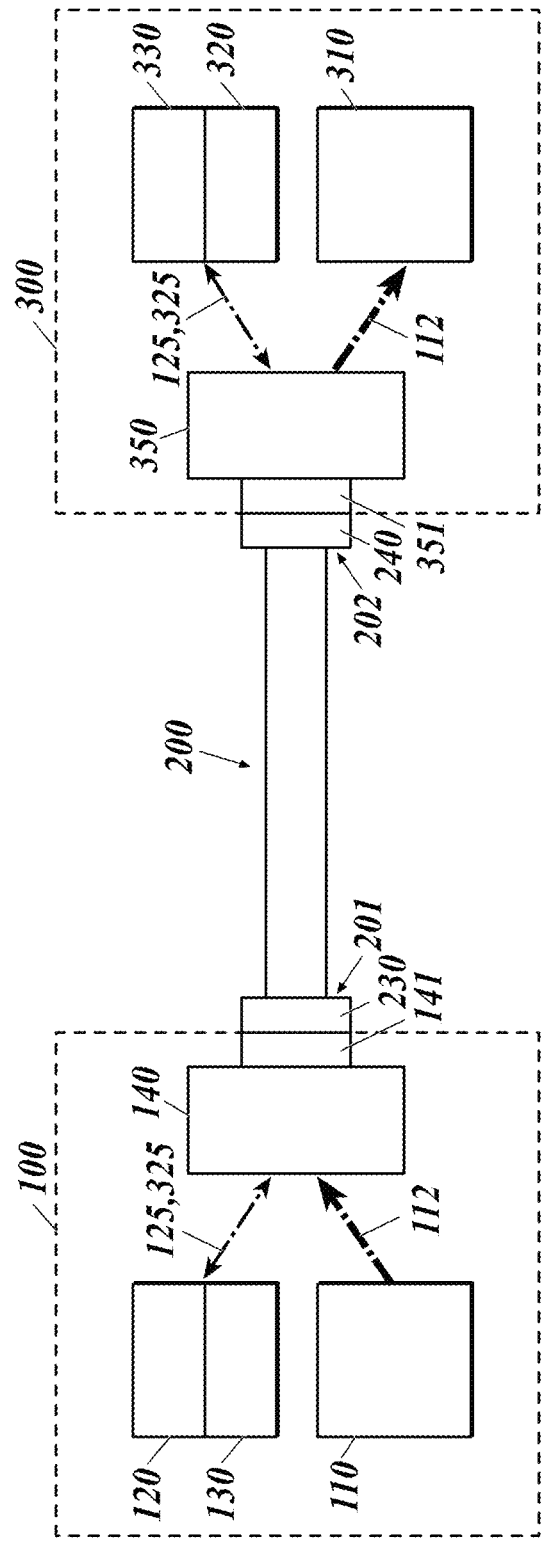
FIG. 3 is a block diagram of the power over fiber system according to the second embodiment of the present disclosure and shows optical connectors and so forth.

As shown in FIG. 3, the first data communication device 100 includes a light input/output part 140 and an optical connector 141 attached to the light input/output part 140, and the second data communication device 300 includes a light input/output part 350 and an optical connector 351 attached to the light input/output part 350. An optical connector 230 provided at the one end 201 of the optical fiber cable 200 is connected to the optical connector 141, and an optical connector 240 provided at the other end 202 of the optical fiber cable 200 is connected to the optical connector 351. The light input/output part 140 guides the feed light 112 to the cladding 220, guides the signal light 125 to the core 210, and guides the signal light 325 to the receiver 130. The light input/output part 350 guides the feed light 112 to the powered device 310, guides the signal light 125 to the receiver 330, and guides the signal light 325 to the core 210.

As described above, the optical fiber cable 200 has the one end 201 connectable to the first data communication device 100 and the other end 202 connectable to the second data communication device 300 to transmit the feed light 112. In this embodiment, the optical fiber cable 200 transmits the signal light 125, 325 bidirectionally.

As the semiconductor materials of the semiconductor regions, which exhibit the light-electricity conversion effect, of the semiconductor laser 111 and the photoelectric conversion element 311, any of those described in the first embodiment can be used, thereby achieving a high optical power supply efficiency.

Figure 4:
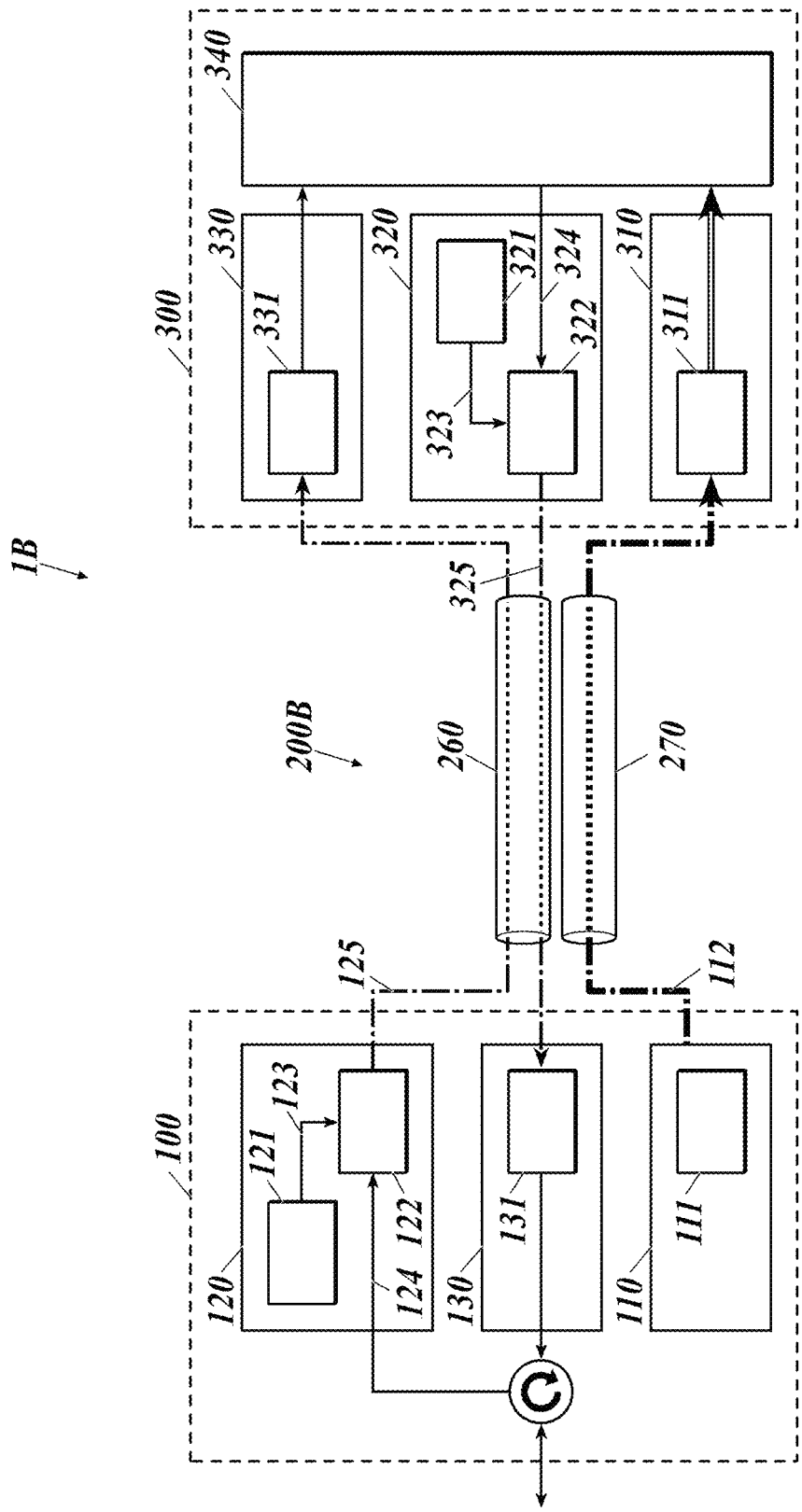
FIG. 4 is a block diagram of a power over fiber system according to another embodiment of the present disclosure.

Like an optical fiber cable 200B of a power over fiber system 1B shown in FIG. 4, an optical fiber 260 that transmits signal light and an optical fiber 270 that transmits feed light may be provided separately. Further, the optical fiber cable 200B may be composed of a plurality of optical fiber cables.

(2) Component that Extends Wavelength of Feed Light

[First Configuration Example having Wavelength Extension Function]

Next, a component that extends the wavelength of feed light will be described with reference to the drawings.

Figure 5:
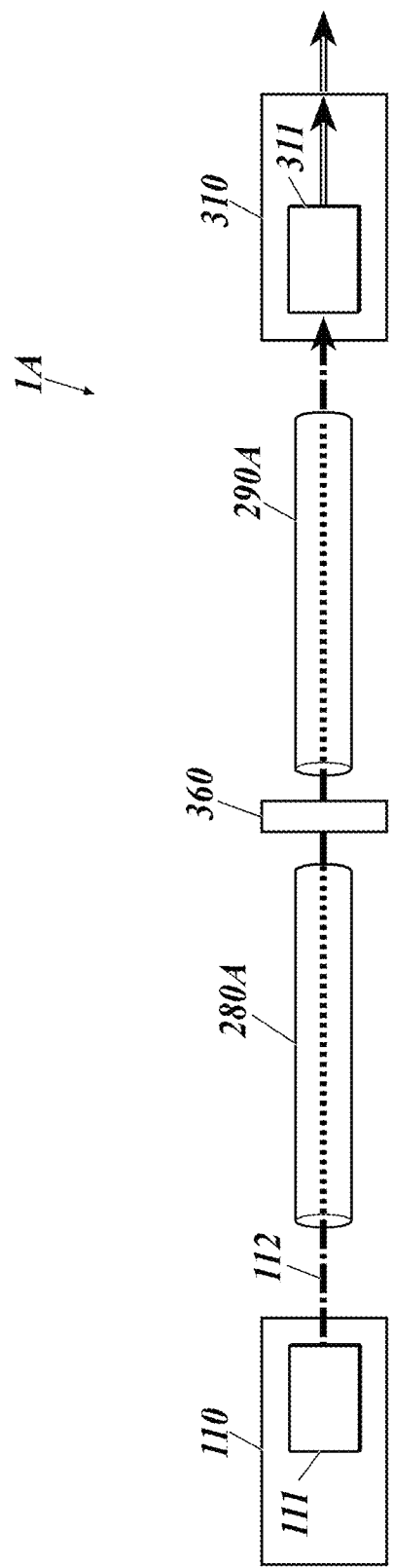
FIG. 5 is a block diagram of a first configuration example of the power over fiber system according to the first embodiment of the present disclosure having a wavelength extension function.

FIG. 5 shows a first configuration example having a wavelength extension function, the first configuration example made by the above-described power over fiber system 1A as a base and an extender 360 that is disposed between the semiconductor laser 111 of the power sourcing equipment 110 and the photoelectric conversion element 311 of the powered device 310 and extends the wavelength of the feed light 112.

In the following description, as a general rule, components donated by the same reference signs as those of already-described components are the same as the already-described components unless otherwise stated.

In the power over fiber system 1A of the first configuration example having the wavelength extension function, instead of the optical fiber cable 200A, a first optical fiber cable 280A and a second optical fiber cable 290A are used to transmit the feed light 112. The extender 360 is interposed between the first optical fiber cable 280A and the second optical fiber cable 290A.

As described above, as the semiconductor material of the semiconductor laser 111, semiconductor materials having a laser wavelength being a short wavelength of 500 nm or less may be used. Further, semiconductor materials of laser media having a band gap of 2.4 eV to 6.2 eV may be used. Examples thereof include diamond, gallium oxide, aluminum nitride and GaN.

Thus, the semiconductor laser 111 that outputs the feed light 112 with a laser wavelength being a short wavelength has a high photoelectric conversion efficiency, and hence can output the feed light with high energy in relation to electric power. Meanwhile, the transmission efficiency of short-wavelength laser is likely to decrease in an optical fiber cable, and the longer the transmission length is, the greater the loss is.

Figure 6:
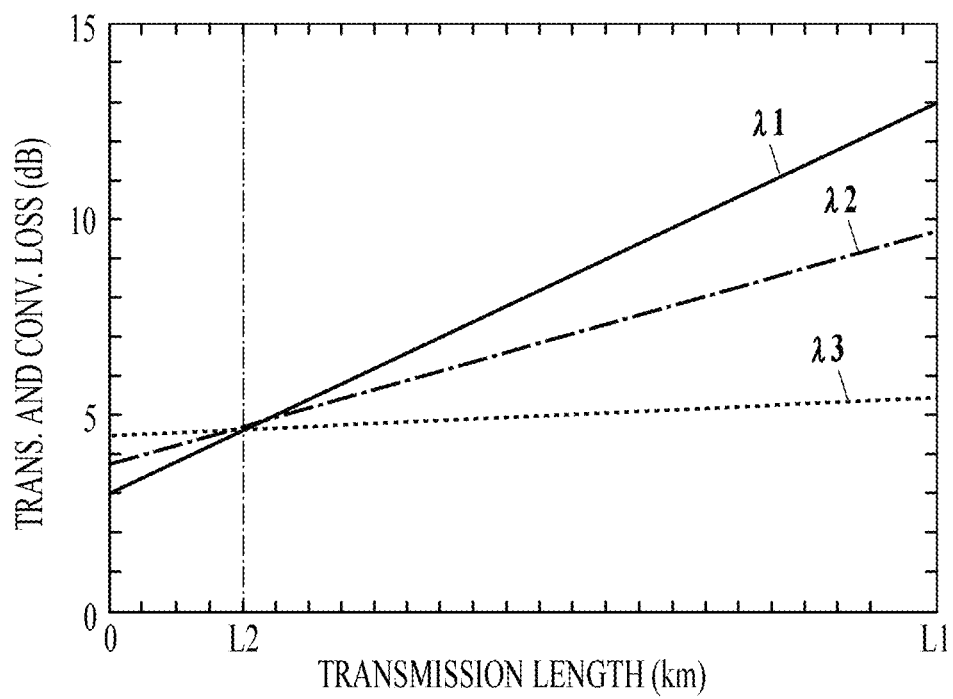
FIG. 6 is a line graph showing a relationship between loss at a transmission destination and transmission length about laser wavelengths of feed light.

FIG. 6 is a line graph showing a relationship between the loss at a transmission destination and the transmission length (loss-to-transmission-length characteristic) about laser wavelengths of feed light. Reference signs $\lambda 1$ to $\lambda 3$ in FIG. 6 represent laser wavelengths, and the wavelengths satisfy "$\lambda 1 < \lambda 2 < \lambda 3$".

The feed light having the shortest laser wavelength, $\lambda 1$, has the highest photoelectric conversion efficiency and accordingly has the smallest loss at 0 km point of the transmission length, but has a high increase rate of the loss with respect to the transmission length being longer and consequently has the largest loss at L1 km point of the transmission length.

The feed light having the second shortest laser wavelength, $\lambda 2$, has a photoelectric conversion efficiency lower than that of $\lambda 1$ and accordingly has a loss larger than that of $\lambda 1$ at 0 km point of the transmission length, but has an increase rate of the loss with respect to the transmission length being longer lower than that of $\lambda 1$ and consequently has a loss at L1 km point of the transmission length smaller than that of $\lambda 1$.

The feed light having the longest laser wavelength, $\lambda 3$, has the lowest photoelectric conversion efficiency and accordingly has the largest loss at 0 km point of the transmission length, but has the lowest increase rate of the loss with respect to the transmission length being longer and consequently has the smallest loss at L1 km point of the transmission length.

For example, if the loss-to-transmission-length characteristic of $\lambda 1$, which represents the shortest laser wavelength, is compared with the loss-to-transmission-length characteristic of $\lambda 3$, which represents the longest laser wavelength, the loss of the feed light having $\lambda 1$, which represents the shortest laser wavelength, is (i) initially smaller than, (ii) at L2 km point of the transmission length, equal to, and (iii) at points beyond L2 km of the transmission length, larger than that of the feed light having $\lambda 3$, which represents the longest laser wavelength.

Hence, if the extender 360 has a characteristic of extending the laser wavelength of the feed light 112 from $\lambda 1$ to $\lambda 3$, and the distance from the semiconductor laser 111 to the photoelectric conversion element 311 is longer than L2, arrangement of the extender 360 at a point where the transmission length is L2 or shorter can reduce the effect of decrease in the transmission efficiency of the feed light 112 having the laser wavelength $\lambda 1$ and enables efficient power supply.

In the power over fiber system 1A of the first configuration example having the wavelength extension function, the first optical fiber cable 280A is disposed between the semiconductor laser 111 and the extender 360, and the second optical fiber cable 290A is disposed between the extender 360 and the photoelectric conversion element 311.

Further, in this power over fiber system 1A, the laser wavelength of the feed light 112 is λ1, and the extender 360 extends the laser wavelength of the feed light 112 from λ1 to λ3, and makes the length of the first optical fiber cable 280A L2.

As the extender 360, phosphor is used, for example. Phosphor has a physical property of absorbing light having a specific wavelength and emitting light having a wavelength different from that of the absorbed light.

The phosphor to be used has a property of performing Stokes shift on the feed light 112 from the laser wavelength λ1 to the laser wavelength λ3.

The phosphor may be either transmissive or reflective. As the extender 360, another component that performs wavelength extension, such as an optical device capable of extending, by using a diffraction grating(s), the wavelength of laser light to be reflected, may be used. Also, an optical waveguide may be used to perform wavelength conversion (extension).

In the power over fiber system 1A of the first configuration example having the wavelength extension function, based on the loss-to-transmission-length characteristic of the laser wavelength λ1, which is before extended by the extender 360, and the loss-to-transmission-length characteristic of the laser wavelength λ3, which is after extended by the extender 360, the first optical fiber cable 280A has the same length as the transmission length L2 where the loss due to the laser wavelength λ1, which is before extended by the extender 360, is equal to the loss due to the laser wavelength λ3, which is after extended by the extender 360.

This can suppress the effect of decrease in the transmission efficiency and enables high-efficient power supply while using the semiconductor laser 111 that outputs the feed light 112 of the laser wavelength λ1 having a high photoelectric conversion efficiency, even if the transmission length is long.

The first optical fiber cable 280A may be equal to or shorter than L2.

An optical fiber cable can optimize the transmission efficiency of feed light, which the optical fiber cable transmits, according to the wavelength of the feed light, by the type of base material of a core or a cladding of the optical fiber cable, the type of additive that is added thereto, the adding amount of the additive and/or the like.

Hence, as the first optical fiber cable 280A, an optical fiber cable suitable for the laser wavelength λ1 may be appropriately selected, and as the second optical fiber cable 290A, an optical fiber cable suitable for the laser wavelength λ3 may be appropriately selected.

Therefore, if an existing power over fiber system 1A having no extender 360 as shown in FIG. 1 is altered to extend the transmission length, the length of an existing optical fiber cable 200A may be adjusted to be used as the first optical fiber cable 280A. This can reduce the load and costs of the extension work, for example.

Further, in the first configuration example having the wavelength extension function, conditions for the semiconductor materials of the semiconductor laser 111 and the photoelectric conversion element 311 may not be the same. Regarding the photoelectric conversion element 311, the semiconductor material of the semiconductor region exhibiting the light-electricity conversion effect to be selected may be a laser medium the photoelectric conversion efficiency of which becomes high at least with a laser wavelength longer than that of the feed light output by the semiconductor laser 111. Further, the semiconductor material of the photoelectric conversion element 311 to be selected may be a laser medium the photoelectric conversion efficiency of which becomes higher with the laser wavelength of the feed light after extended by the extender 360 than with the laser wavelength of the feed light before extended by the extender 360, or becomes the highest with the laser wavelength of the feed light after extended by the extender 360.

[Second Configuration Example having Wavelength Extension Function]

Figure 7:
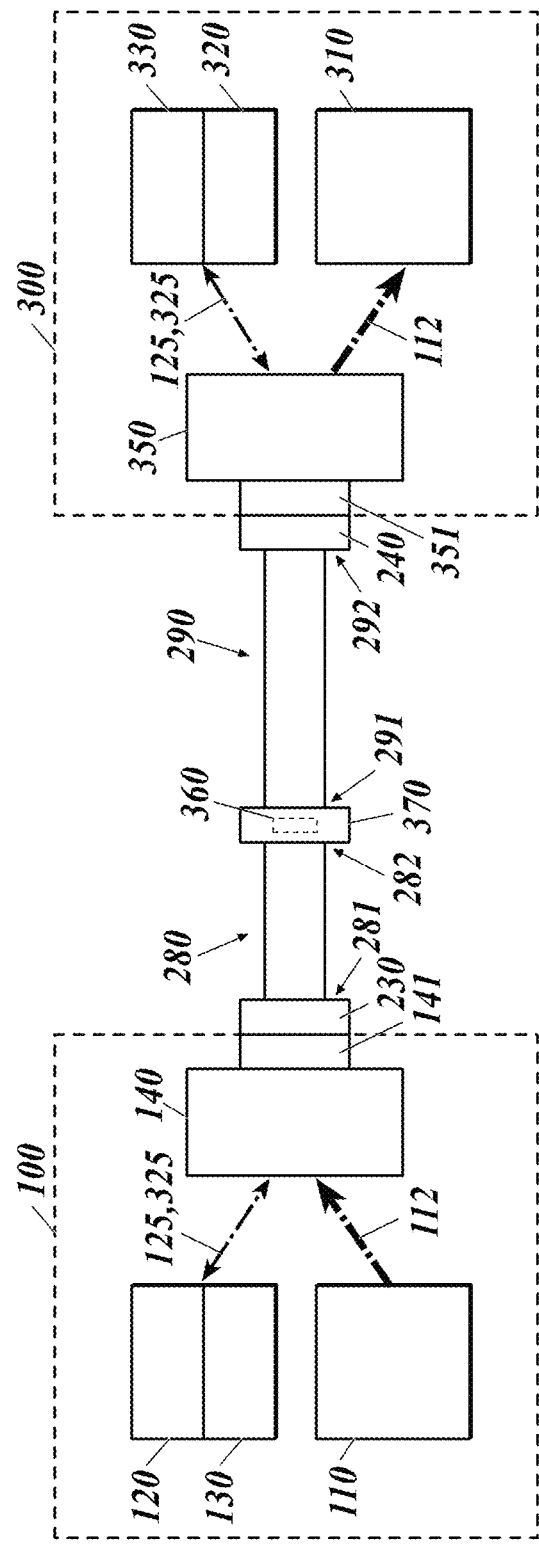
FIG. 7 is a block diagram of a second configuration example of the power over fiber system according to the second embodiment of the present disclosure having a wavelength extension function.

FIG. 7 shows a second configuration example having a wavelength extension function, the second configuration example made by the above-described power over fiber system 1 as a base and an extender 360 that is disposed between the semiconductor laser 111 of the first data communication device 100 and the photoelectric conversion element 311 of the second data communication device 300 and extends the wavelength of the feed light 112.

In the power over fiber system 1 of the second configuration example having the wavelength extension function, instead of the optical fiber cable 200, a first optical fiber cable 280 and a second optical fiber cable 290 are used to transmit the feed light 112. The extender 360 is interposed between the first optical fiber cable 280 and the second optical fiber cable 290.

The extender 360 is the same as that in the first configuration example having the wavelength extension function shown in FIG. 5.

The extender 360 extends the laser wavelength λ1 of the feed light 112 to the laser wavelength λ3.

The first optical fiber cable 280 has one end 281 provided with the optical connector 230 connected to the optical connector 141 and the other end 282 connected to an optical connector 370 having the extender 360 therein.

The second optical fiber cable 290 has one end 291 connected to the optical connector 370 and the other end 292 provided with the optical connector 240 connected to the optical connector 351.

The light input/output part 140 guides the feed light 112 to the cladding of the first optical fiber cable 280, guides the signal light 125 to the core of the first optical fiber cable 280, and guides the signal light 325 to the receiver 130.

The light input/output part 350 guides the feed light 112 to the powered device 310, guides the signal light 125 to the receiver 330, and guides the signal light 325 to the core of the second optical fiber cable 290.

The optical connector 370 couples the first optical fiber cable 280 and the second optical fiber cable 290.

The optical connector 370 connects the core of the first optical fiber cable 280 and the core of the second optical fiber cable 290 to transmit the signal light 125, 325 between these.

The optical connector 370 connects the cladding of the first optical fiber cable 280 and the cladding of the second optical fiber cable 290 through the extender 360 to extend the wavelength of the feed light from λ1 to λ3 and transmit the feed light from the first optical fiber cable 280 to the second optical fiber cable 290.

In the second configuration example having the wavelength extension function, as in the first configuration example having the wavelength extension function, the extender 360 extends the laser wavelength of the feed light 112 from λ1 to λ3 and adjusts the first optical fiber cable 280 to a proper length. This can improve the transmission efficiency and enables high-efficient feed-light supply while outputting the feed light with a high photoelectric conversion efficiency. This can also transmit the feed light farther.

Although some embodiments of the present disclosure have been described above, these embodiments are made for purposes of illustration and example only. The present invention can be carried out in various other forms, and each component may be omitted, replaced or modified/changed within a range not departing from the scope of the present invention.

For example, FIG. 7 shows an example in which the component having the wavelength extension function is applied to the power over fiber system 1, but the component having the wavelength extension function is also applicable to the power over fiber system 1B in the same manner.

INDUSTRIAL APPLICABILITY

An optical power supply system according to the present invention has industrial applicability to an optical power supply system that performs power supply by changing the laser wavelength.

REFERENCE SIGNS LIST 1, 1A, 1B Power over Fiber System
100 First Data Communication Device
110 Power Sourcing Equipment
111 Semiconductor Laser for Power Supply
112 Feed Light
120 Transmitter
121 Semiconductor Laser for Signals
123 Laser Light
124 Transmission Data
125 Signal Light
130 Receiver
131 Photodiode for Signals
200, 200A, 200B Optical Fiber Cable
210 Core
220 Cladding
250A Optical Fiber
260 Optical Fiber
270 Optical Fiber
280, 280A First Optical Fiber Cable
290, 290A Second Optical Fiber Cable
300 Second Data Communication Device
310 Powered Device
311 Photoelectric Conversion Element
320 Transmitter
321 Semiconductor Laser for Signals
323 Laser Light
324 Transmission Data
325 Signal Light
330 Receiver
331 Photodiode for Signals
340 Data Processing Unit
350 Light Input/Output Part
360 Extender
370 Optical Connector
L1, L2 Transmission Length
$\lambda 1, \lambda 2, \lambda 3$ Laser Wavelength

The invention claimed is:

1. A power over fiber system comprising:
a power sourcing equipment including a semiconductor laser that is configured to output feed light;
a powered device including a photoelectric conversion element that is configured to convert the feed light into electric power;
an extender that is configured to extend a laser wavelength of the feed light;
a first optical fiber cable that is configured to transmit the feed light having a first laser wavelength from the power sourcing equipment to the extender; and
a second optical fiber cable that is configured to transmit the feed light having a second laser wavelength from the extender to the powered device,
wherein
the extender is configured to extend the first laser wavelength of the feed light to the second laser wavelength of the feed light,
based on a loss-to-transmission-length characteristic of the first laser wavelength before extended by the extender and a loss-to-transmission-length characteristic of the second laser wavelength after extended by the extender, the first optical fiber cable has a length that is equal to or shorter than a transmission length where a loss due to the first laser wavelength before extended by the extender is equal to a loss due to the second laser wavelength after extended by the extender and
the extender contains phosphor.

2. The power over fiber system according to claim 1, wherein a semiconductor material of a semiconductor region of the semiconductor laser, the semiconductor region exhibiting a light-electricity conversion effect, is a laser medium having a laser wavelength of 500 nm or less.

3. The power over fiber system according to claim 1, wherein a semiconductor material of a semiconductor region of the photoelectric conversion element, the semiconductor region exhibiting a light-electricity conversion effect, is a laser medium a photoelectric conversion efficiency of which becomes high with a wavelength longer than the laser wavelength of the semiconductor laser.

4. The power over fiber system according to claim 2, wherein a semiconductor material of a semiconductor region of the photoelectric conversion element, the semiconductor region exhibiting a light-electricity conversion effect, is a laser medium a photoelectric conversion efficiency of which becomes high with a wavelength longer than the laser wavelength of the semiconductor laser.

5. A power over fiber system, comprising:
a power sourcing equipment including a semiconductor laser that is configured to output feed light;
a powered device including a photoelectric conversion element that is configured to convert the feed light into electric power;
an extender that is configured to extend a laser wavelength of the feed light;
a first optical fiber cable that is configured to transmit the feed light having a first laser wavelength from the power sourcing equipment to the extender; and
a second optical fiber cable that is configured to transmit the feed light having a second laser wavelength from the extender to the powered device,
wherein
the extender is configured to extend the first laser wavelength of the feed light to the second laser wavelength of the feed light,
based on a loss-to-transmission-length characteristic of the first laser wavelength before extended by the extender and a loss-to-transmission-length characteristic of the second laser wavelength after extended by the extender, the first optical fiber cable has a length that is equal to or shorter than a transmission length where a loss due to the first laser wavelength before extended by the extender is equal to a loss due to the second laser wavelength after extended by the extender, and a semiconductor material of a semiconductor region of the photoelectric conversion element, the semiconductor region exhibiting a light-electricity conversion effect, is a laser medium a photoelectric conversion efficiency of which becomes high with a wavelength longer than the laser wavelength of the semiconductor laser.

\* \* \* \* \*